United States Patent
Zeller

(10) Patent No.: US 10,502,801 B2
(45) Date of Patent: Dec. 10, 2019

(54) METHOD AND MAGNETIC RESONANCE APPARATUS FOR GENERATING A WEIGHTING MATRIX FOR REDUCING ARTIFACTS WITH PARALLEL IMAGING

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 128 days.

(21) Appl. No.: 15/890,539

(22) Filed: Feb. 7, 2018

(65) Prior Publication Data

US 2018/0224513 A1    Aug. 9, 2018

(30) Foreign Application Priority Data

Feb. 7, 2017    (DE) .................. 10 2017 201 883

(51) Int. Cl.
 G01R 33/54    (2006.01)
 G01R 33/56    (2006.01)
 (Continued)

(52) U.S. Cl.
 CPC ... G01R 33/5602 (2013.01); G01R 33/34092 (2013.01); G01R 33/3671 (2013.01);
 (Continued)

(58) Field of Classification Search
 CPC .............. G01R 33/543; G01R 33/5608; G01R 33/4828
 (Continued)

(56) References Cited

U.S. PATENT DOCUMENTS 4,521,734 A * 6/1985 Macovski ............ G01R 33/445
324/311
4,812,753 A * 3/1989 Fuderer ................ G01R 33/341
324/307

(Continued)

OTHER PUBLICATIONS

Robinson. et al: "An illustrated comparison of processing methods for MR phase imaging and QSM: combining array coil signals and phase unwrapping" NMR in Biomedicine vol. 30; e3601; pp. 1-18 (2017).

(Continued)

*Primary Examiner* — Patrick Assouad
*Assistant Examiner* — Taqi R Nasir
(74) *Attorney, Agent, or Firm* — Schiff Hardin LLP

(57) ABSTRACT

In a magnetic resonance (MR) apparatus and an operating method therefor, the MR apparatus has multiple reception coils each having an associated reception channel, a reference dataset is obtained from an examination volume of a subject, wherein the reference dataset completely fills a region of k-space. In a computer, a subregion of the examination volume is determined that has a lower homogeneity than other subregions of the examination volume, and the computer also determines at least one of the reception channels in which raw data signals are received that have a higher intensity in the determined subregion than others of the reception channels. The computer calculates a weighting matrix, in which signals, the determined reception channel are given a lower weighting than signals from the other channels. The weighting matrix is then applied to diagnostic data acquired with parallel imaging using the multiple reception coils and channels.

15 Claims, 4 Drawing Sheets

(51) Int. Cl.
*G01R 33/36* (2006.01)
*G01R 33/561* (2006.01)
*G01R 33/34* (2006.01)
*G01R 33/48* (2006.01)
*G01R 33/565* (2006.01)

(52) U.S. Cl.
CPC ....... *G01R 33/4812* (2013.01); *G01R 33/543* (2013.01); *G01R 33/5608* (2013.01); *G01R 33/5611* (2013.01); *G01R 33/5612* (2013.01); *G01R 33/56563* (2013.01); *G01R 33/56572* (2013.01)

(58) Field of Classification Search
USPC .................. 324/307, 309, 318, 322, 314
See application file for complete search history.

(56) References Cited

U.S. PATENT DOCUMENTS

| | | | | |
|---|---|---|---|---|
| 6,265,876 | B1* | 7/2001 | Carrozzi | G01R 33/34053 324/318 |
| 2003/0001571 | A1* | 1/2003 | Wang | G01R 33/3415 324/309 |
| 2007/0280520 | A1* | 12/2007 | Takai | G01R 33/5616 382/131 |
| 2013/0229176 | A1* | 9/2013 | Fautz | G01R 33/246 324/307 |
| 2014/0015528 | A1* | 1/2014 | Landschuetz | G01R 33/56509 324/309 |
| 2015/0077107 | A1* | 3/2015 | Sharp | G01R 33/56563 324/309 |
| 2016/0025833 | A1 | 1/2016 | Polimeni et al. | |
| 2016/0109546 | A1* | 4/2016 | Machii | G01R 33/56554 324/322 |
| 2017/0315204 | A1 | 11/2017 | Schneider et al. | |

OTHER PUBLICATIONS

Fang et al: "Adaptively Optimized Combination (AOC) of Magnetic Resonance Spectroscopy Data from Phased Array Coils". In: Magnetic Resonance in Medicine vol. 75; pp. 2235-2244 (2016).

Benkhedah et al: "Evaluation of Adaptive Combination of 30-Channel Head Receive Coil Array Data in 23Na MR imaging". Magnetic Resonance in Medicine ( vol. 75; pp: 527-536 (2016).

German Examination Report dated Oct. 2, 2018, German Application No. 10 2017 201 883.6.

Decision to Grant dated Dec. 13, 2018 in German Application 10 2017 201 883.

* cited by examiner

METHOD AND MAGNETIC RESONANCE APPARATUS FOR GENERATING A WEIGHTING MATRIX FOR REDUCING ARTIFACTS WITH PARALLEL IMAGING

BACKGROUND OF THE INVENTION

Field of the Invention

The invention concerns a method for generating a weighting matrix, which is used when creating magnetic resonance (MR) images of a recording volume of an examination object with parallel imaging in an MR system with a plurality of reception channels. The invention also concerns an MR system, and a non-transitory, and electronically readable data carrier, encoded with programming instructions, for implementing such a method.

Description of the Prior Art

MR systems with a relatively short patient-receiving bore have reduced homogeneity of the constant magnetic field $B0$ and reduced gradient accuracy at the edges of the field of view in the bore direction, which is conventionally called the z-axis. For coronary and sagittal recordings, this leads to compressed regions in the reconstructed images with high signal intensity in the regions at the edge of the bore because multiple regions of the examination object are depicted on one image point as a result of the inhomogeneity of the gradient field and/or the polarization field $B0$, thus causing the signal intensity to increase at this image point. This means that incorrect spatial encoding results at image points with increased signal intensity. These regions are generally located at the edge of the field of view in the z-direction, also called the field of view (FOV). In addition, in the case of imaging sequences that use a parallel imaging technique (multiple reception coils each having an associated reception channel), such as GRAPPA, artifacts often occur at integer multiples of the position FOVz/R, where R is the acceleration factor. In the case of parallel imaging, the missing raw data regions that have not been scanned (because in parallel imaging the data acquired in each reception channel do not fill the entirety of k-space) are calculated with the use of a number of reception channels and their different coil sensitivities. Scans called reference scans or calibration scans are used to determine the coil sensitivities. This requires a good reference or calibration dataset. If this dataset is incorrect, the MR images calculated using parallel imaging are also incorrect. Another cause of artifacts during parallel imaging is the fact that the imaging algorithms are conventionally not capable of dealing with locally restricted regions with very high signal intensity, which, as described above, can occur at the edges of MR system components. Particularly in the case of parallel imaging, this leads to incomplete suppression of so-called aliasing artifacts in these regions.

This phenomenon is particularly prominent with spin-echo sequences since there dephasing due to B0 inhomogeneities or gradient inhomogeneities plays a less significant role and does not lead to signal loss as in the case of gradient echo sequences.

One possibility for reducing these artifacts is to average the MR signals, wherein the MR signals are recorded twice or multiple times, for example twice, i.e. once with recording of the even k-space lines and once with recording of the odd k-space lines. The central k-space lines of the two recordings are then combined and used to calculate the reference or calibration datasets. A method of this kind eliminates artifacts in the final compiled image, but the scanning time is at least doubled and this is a significant drawback.

SUMMARY OF THE INVENTION

An object of the invention is to reduce the aforementioned drawbacks and in particular to reduce the artifacts that occur in the subregions of the recording volume at which there is high inhomogeneity in the $B0$ field or in the gradient field.

According to a first aspect of the invention, a method for generating a weighting matrix is provided, which is used when creating MR images of a recording volume of an examination object with parallel imaging in an MR system with a number of reception channels. A reference dataset of the examination object is obtained by operating the MR apparatus so as to completely fill at least one segment of the associated raw data region (k-space) with raw data. Furthermore, a first subregion in the recording volume is determined in a computer, in which at least one component or data acquisition attribute of the MR system has a lower homogeneity than in a second subregion of the recording volume. Furthermore, at least one first reception channel of the multiple reception channels is determined in the computer that supplies a higher signal intensity in the first subregion of the recording volume than other reception channels of the multiple reception channels. Then, the weighting matrix is calculated in the computer with which raw data points not recorded during parallel imaging are determined using the reference dataset, accessed by the computer. Now, during the calculation of the weighting matrix, the at least one reception channel is given a lower weighting than the other reception channels.

The weighting matrix is then applied to the raw data acquired during the parallel imaging, so as to produce weighted raw data. It is the weighted raw data that are then used as the input to the reconstruction algorithm that is used to generate the image data. The image data generated from the weighted raw data are made available from the computer in electronic form, as a data file.

The artifacts that form in the first subregion can be reduced because they mainly originate from the reception channels that supply a high signal intensity in the first subregion with low homogeneity or have high coil sensitivity. When calculating the weighting matrix for the missing raw data points in parallel imaging, these reception channels are given a lower weighting so that, during the calculation of the weighting or calibration matrix, these reception channels in the first subregion are given a weighting that is lower than the weighting of the reception channels in the second subregion where the resulting inhomogeneity is lower than in the first subregion.

Herein, in the at least one first reception channel it is possible to reduce a raw data intensity compared to the raw data intensity of the other reception channels by at least the factor 1.2 or more, for example the factor 5, or the factor 10. The weighting matrix is then calculated with the raw data intensity reduced in this way in the at least one first reception channel, i.e. in the reception channels with high signal intensity in the first subregion. Scanned MR signals are used in the calculation of the weighting matrix. The reduction of the signal intensity during the calculation of the weighting matrix causes the artifacts induced by the higher inhomogeneity to be transferred to a lesser degree to the missing raw data points to be calculated during parallel imaging.

It is also possible for artificial noise to be added to the reduced raw data intensity before the weighting matrix is calculated. It is also possible for the raw data intensity to be completely replaced by artificial noise only in the at least one reception channel, wherein then the weighting matrix is calculated with the raw data intensity in the at least one first reception channel that only contains artificial noise.

This measure reduces the overall intensity or the signal-to-noise ratio so that the other channels in which the inhomogeneity is lower make a greater contribution and hence the weighting matrix transfers the artifacts in the first subregion to a lesser degree to the remaining regions of the examination volume.

It is also possible, in the at least one first reception channel, for a raw data intensity to be filtered with a smoothing filter, for example a Gaussian filter, before the weighting matrix is then calculated with the filtered raw data intensities.

All the above-described different possibilities assist in giving a lower weighting to the channels with high signal intensity in the case of high inhomogeneities so that the inaccuracies in the image creation induced by the inhomogeneities are not used, or are used to a lower degree, for the calculation of the missing raw data points.

There are several possibilities for determining the at least one first reception channel. The raw data intensity can be determined based on identification data for the recording volume. With this identification data, it is possible to use coil sensitivity maps of the multiple reception coils, a raw dataset with a comparatively low resolution with which, however, the raw data region was completely recorded or data held in a database obtained from previous scans or field calculations.

Herein, the parallel imaging can be embodied such that a phase-encoding direction in parallel imaging is selected such that the first subregion of the recording volume is located further away from the isocenter of the magnet of the MR system than the second subregion, wherein the first subregion is connected to the second subregion in the phase-encoding direction. This means that, in the phase-encoding direction, the second subregion is located centrally around the isocenter while, in the edge regions, the reception coils are identified that supply a high signal intensity in these edge regions.

The MR images of the examination object during parallel imaging can then be determined using the weighting matrix calculated as explained above.

The first subregion in the recording volume may be determined such that there a relationship between the physical location in the MR system and the Larmor frequency differs in each case more than 10% from a reference value, for example more than 5% or more than 7%. Herein, the reference value is a linear relationship between the physical location in the MR system and the Larmor frequency when using gradients and is a constant relationship with the B0 field without gradient switching.

The invention further concerns an MR system with a control computer and a memory, wherein the memory stores control information that can be executed by the control computer so as to operate the MR system in order to implement the above-described steps.

The present invention also encompasses a non-transitory, computer-readable data storage medium encoded with programming instructions that, when the storage medium is loaded into a control computer (or distributively) into a computer system of an MR apparatus, caused the computer or computer system to operate the MR apparatus so as to implement any or all embodiments of the method according to the invention, as described above.

DESCRIPTION OF THE PREFERRED EMBODIMENTS

Figure 1:
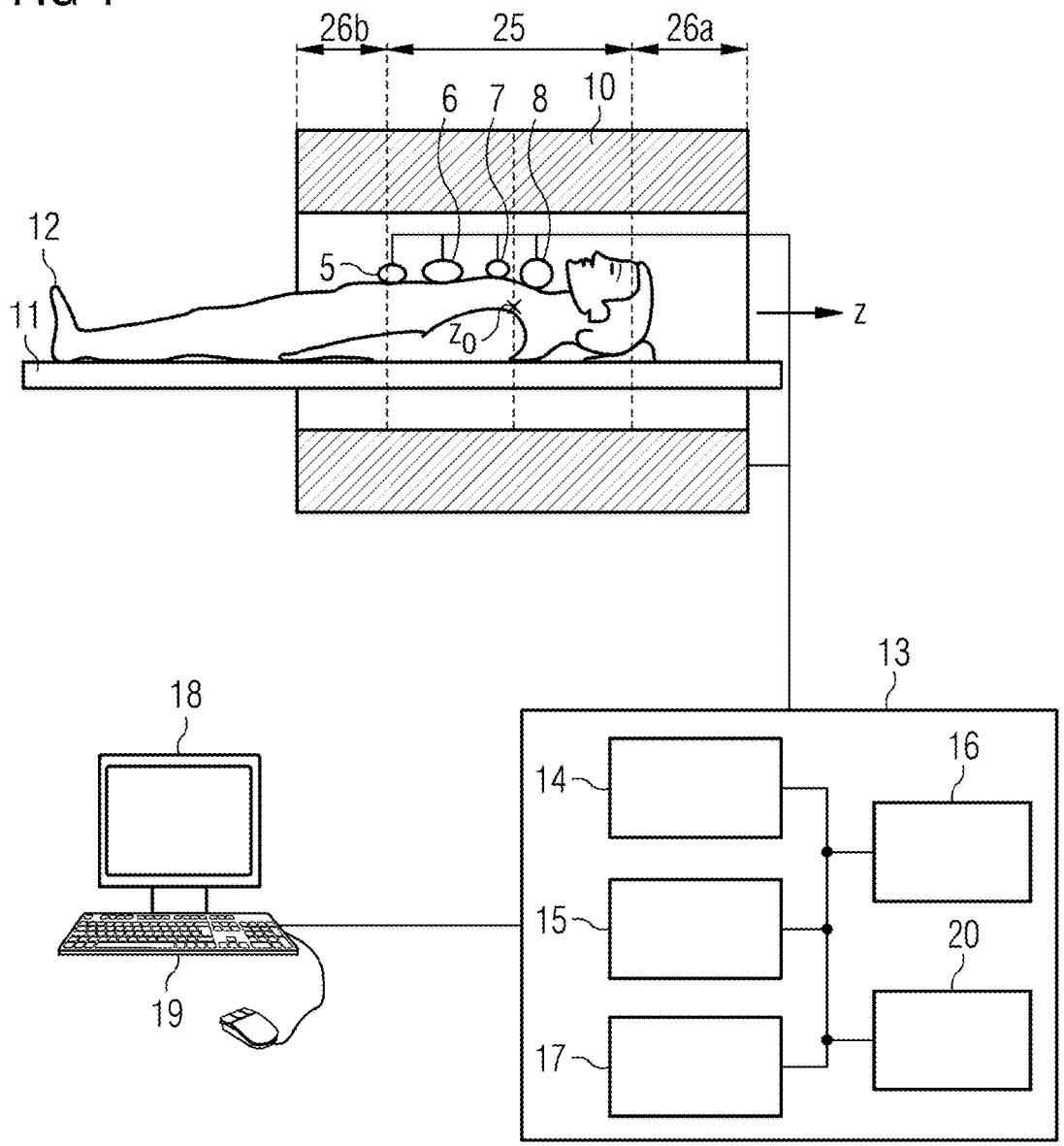
FIG. 1 schematically illustrates an MR system according to the invention, with which, using a parallel imaging technique, artifacts induced by higher inhomogeneity can be reduced in a subregion of the MR system.

FIG. 1 schematically shows an MR system with which, according to the invention, artifacts are avoided in an edge region of the MR system, resulting from encoding of different tissue in one single image point. The magnetic resonance system was a scanner with a magnet 10 that generates a polarization field B0. A patient on a patient table 11 represents the examination object 12 and is moved into an isocenter Z0 of the magnet 10 in order there to record spatially encoded magnetic resonance signals from the examination object 12. As will be explained in detail below, the recording volume has a first recording region 26a and 26b with a higher inhomogeneity of MR components, and a second recording region 25, in which the homogeneity of those MR components is higher than in the first subregion. Here, the MR component used can be the polarization field B0 and/or the linearity of the magnetic field gradients generated by gradient coils (not shown) for the spatial encoding. The radiation of radio-frequency pulses and switching of magnetic field gradients can cause the magnetization generated by the polarization field B0 to be disrupted by deflection of the nuclear spins out of the equilibrium position and the currents induced on the return to the equilibrium position in reception coils 5 to 8 can be converted into magnetic resonance signals. The general manner of operation for the creation of MR images with detection of magnetic resonance signals, in particular during parallel imaging using a weighting matrix for generating non-recorded raw data points, is known to those skilled in the art so that a more detailed description is not necessary herein.

The magnetic resonance system further has a control computer 13 that controls the MR system. The control computer 13 includes a gradient controller 14 that controls and switches the magnetic field gradients, and an RF controller 15 that generates and controls the RF pulses for deflecting the nuclear spins out of the equilibrium position. The RF unit is a multi-channel RF unit that generates RF pulses respectively in a number of independent channels. A memory 16 stores the imaging sequence necessary for recording the MR images and all further control information necessary for carrying out the invention. An image-sequence controller 17 controls the image recording and hence the sequence of magnetic field gradients and the RF pulses and the reception time intervals of the MR signals dependent on the selected imaging sequences. Thus, the image-sequence controller 17 also controls the gradient controller 14 and the RF controller 15. An image computer 20 calculates MR image data that can be displayed, as images, on a screen 18. An operator can control the MR system via an input unit 19. The computer 13 can be used, inter alia, to calculate a weighting matrix or the so-called kernel, such as the GRAPPA kernel, so that the inhomogeneities that occur in the first subregion 26a and 26b do not influence the creation of the MR images with parallel imaging, or only influence this to a small degree.

Figure 2:
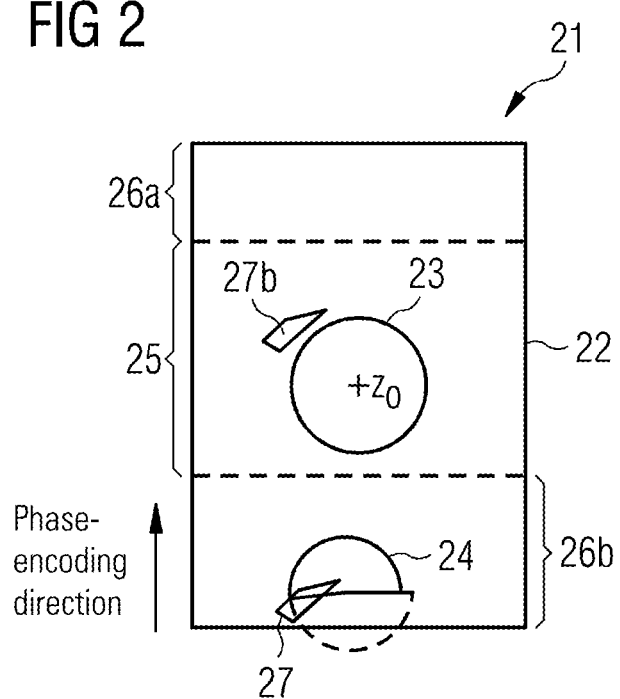
FIG. 2 schematically illustrates an example of an MR image in which, in an edge region, an artifact occurs that can be avoided with the MR system of FIG. 1.

FIG. 2 schematically shows an MR image 22, which is an MR image of a first examination object 23 and a second examination object 24. The examination object 24 is positioned at the edge of the MR system in the phase-encoding direction, i.e. at the edge at which the homogeneity of the polarization field B0 is lower and at which the linearity of the magnetic field gradients is lower than in the region in which the object 23 is arranged. In the embodiment shown in FIG. 2, it is assumed that the first examination object 23 is arranged substantially centrally in the isocenter Z0 of the magnet. In this second subregion 25, there is a first homogeneity of the polarization field B0 and the magnetic field gradients during image recording. Even after adjustment of all system components to the examination object, called shimming, there is a first subregion 26a and 26b in which the magnetic field homogeneity and the gradient linearity are lower than in the second subregion. This first subregion can be defined by the relationship between its physical location in the MR system to the Larmor frequency of the spins in each case in each case differing by 5%, 7% or 10% from the reference value, which is a linear relationship between location and the Larmor frequency with switching of gradients and a constant value with disabled gradients. The increased inhomogeneity in the subregion 26a and 26b, here the subregion of 26b, leads to increased placing of tissue in one single image point for the examination object 24, wherein, as shown in FIG. 2, the phase-encoding direction is perpendicular to the division of the recording volume into the subregions. Artifacts 27 with a high signal intensity can result induced by the fact that, during reconstruction, a plurality of image points are placed on a single point, i.e. a single pixel, in the MR image. Incorrect calibration of parallel imaging as a result of the high signal intensity can cause the artifacts 27 to alias at least partially as an additional artifact 27b into the field-of-view region 25 and there to be superimposed on the object 23, which can complicate diagnosis. Such artifacts 27b can be reduced or prevented when the weighting matrix for parallel imaging is calculated as explained below.

The artifacts may occur with a coronary or sagittal orientation, wherein the phase-encoding direction is in the head or foot direction in order to reduce flow-induced artifacts. Herein, typically only a very low extent of the field of view in the head or foot direction is used, such as, for example, 250 mm, wherein signals are also recorded outside the field of view in the phase-encoding direction, called "phase-oversampling", in order to prevent the aliasing of body structures outside the field of view into the field of view.

The invention can be used with particular advantage during parallel imaging. In particular, with image reconstruction known by the name GRAPPA, artifacts occur as designated 27b in FIG. 2. It has been found that according to the invention these artifacts originate from a few reception channels with high signal intensity or high sensitivity in the first subregion 26a or 26b. The signal intensity is used during the calculation of the weighting matrix in order, with the use of a reference dataset with which at least one segment of the raw data region was recorded completely, to calculate the raw data points that were not recorded during parallel imaging. These reception channels are now determined in order to be given a lower weighting in the weighting matrix than the reception channels which have high sensitivity in the second subregion 25 in FIG. 2. In one step of the method, the reception channels with a high signal contribution in the first subregion are identified. These reception channels can be determined in various ways. For example, it is possible to record an identification dataset with a lower resolution than the MR images that are to be reconstructed later with parallel imaging, with the identification dataset completely filling the associated raw data region (k-space region), meaning that every point in k-space in this region has a data entry threat (no under-sampling). The signal intensity in these items of identification data can now be compared in the first subregion 26a and 26b of the field of view in the phase-encoding direction for the different reception coils and it is possible to identify a number of coil elements with the greatest contribution or the highest signal intensity in this first subregion. It is also possible to use coil sensitivity maps and then also identify the reception channels, which open up high coil sensitivity in the first subregion. It is also possible to use magnetic field maps that enable the identification of the first subregion 26a or 26b as shown in FIG. 2. It is also possible to use data from determinations of the reception channels performed in previous scanning steps or in the past with similar examinations or the channels that will probably have high signal intensity by simulation or calculation based on previous knowledge of the object orientation and physical parameters of magnet and gradient system.

Then, the number of these reception channels is reduced during the determination of the weighting matrix. It is possible to reduce the signal contribution of these identified reception channels, the first reception channels. For example, it is possible to divide the raw-data value by a prespecified number, for example by a factor 5 or 10, and then add artificial noise. It is also possible to replace the signal intensity in these channels by noise only. A further possibility is to smooth the raw data intensities in the respective channels, for example using a Gaussian filter.

As is known from GRAPPA reconstruction, missing data points in an individual receiver coil j are reconstructed by a linear combination of the weighting matrix of the recorded raw data points from all N coils, wherein it is assumed that N coils are present.

$$S_j(k_a) = \sum_{i=1}^{N} \sum_{b=1}^{N_b} w(j, a, l, b) \cdot S_i(k_b)$$

In this equation, index $S_j$ indicates the received signal in a coil j and $k_a$ is the location of the missing raw-data lines in the k-space, $k_b$ are the locations of the surrounding recorded raw-data lines and w(j,a,l,b) are the weighting coefficients to be determined. Usually a calibration dataset with a few data lines $k_b$, for example with $N_b$ equal to 20, is sufficient to achieve satisfactory results.

In the previously determined at least one channel S with increased signal intensity in the edge regions, the signal intensities are now reduced as explained above. Then, the weighting matrix w(j,a,l,b) is determined from the above equation according to the GRAPPA method (i.e. by matrix inversion). This weighting matrix can then be applied to the actual parallel imaging. The addition of artificial noise during parallel imaging makes sense in the present case, since, in the present case, the recording volume has a central segment, the actual field of view, and MR signals are recorded in a larger segment by a technique known as "phase-oversampling", wherein these segments are not then used during the reconstruction. The described method enables lower weighting of the channels with unwanted signal components and, however, has virtually no influence on the signal-to-noise ratio in the image since the reception channels covering the region containing the desired image information are not affected.

Figures 4, 5:
FIG. 4 schematically shows data from different reception channels, which are used to identify the reception channels with high signal intensity in a first subregion with high field inhomogeneity.
FIG. 5 schematically shows a weighting matrix with which the identified reception channels are given a lower weighting.

The adjustment of the weighting matrix is explained schematically in more detail in connection with FIGS. 4 and 5. FIG. 4 is a schematic view of the signal contributions in the different reception channels, in the example shown 20 reception channels, wherein each channel represents an identification dataset 41. The sets of identification data are raw-data sets for the different channels. In these channels and identification data sets 41, the channels are now identified that have high signal intensity in the first subregion 26a, 26b. For example, these can be the channels 3, 4, 5 and 19. These identified reception channels are then modified as described above, i.e. reduced in intensity, overlaid with artificial noise, filtered, or a combination of these methods. FIG. 5 is a schematic illustration of the weighting matrix, wherein the individual rows represent channels 1-20, and the individual columns the weighting factors for the individual channels. If, in the case of 20 channels, in each case four neighbors are used in one direction, such as the ky direction, and five neighbors in the other direction, for example the kx direction, this results in 400 weighting factors for each channel. Herein, the weighting matrix 50 depicted in FIG. 5 is the weighting matrix for a channel, for example channel 6, which was determined by solving the above equation. In this channel 6, the above-described modification of channels 3, 4, 5 and 19 causes the 20×400 now to be modified such that, in the matrix for the depicted channel with all matrix elements describing the contributions from the channels 3, 4, 5 and 19, the intensities were reduced. Hence, the corresponding rows in the weighting matrix and weighting factors in the rows of the other trace elements weighting the contributions of these four channels have lower intensities.

Figure 3:
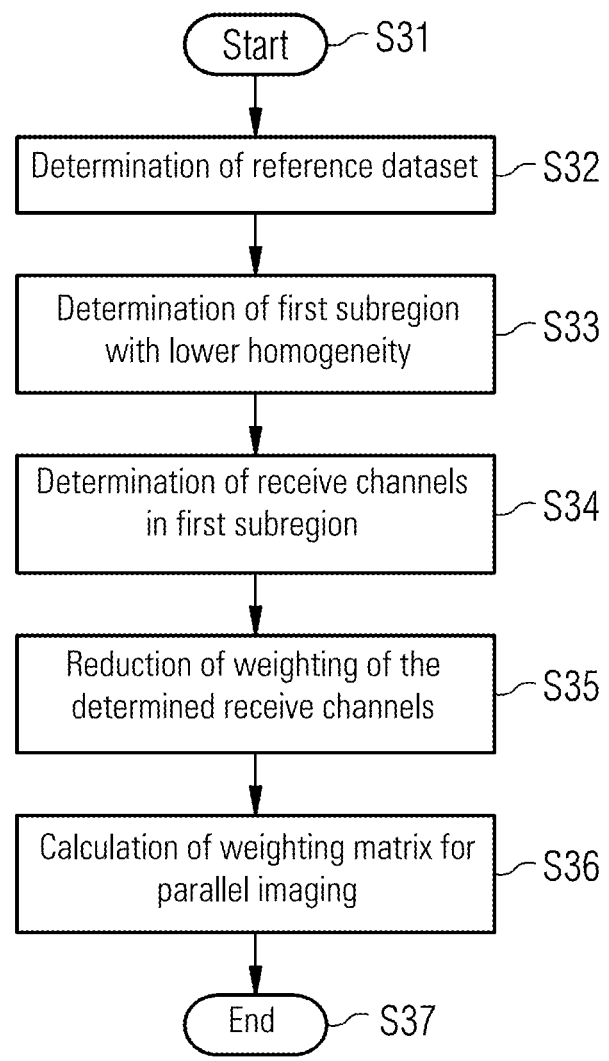
FIG. 3 is a flow chart for recalculating a weighting matrix with which the artifacts shown in FIG. 2 can be reduced.

FIG. 3 summarizes the steps. The method starts in a step S31 and step S32 is the determination of a reference dataset that is used for the calculation of the weighting matrix. Preferably, the reference dataset is recorded so that a k-space-subregion is completely recorded in order to determine the weighting coefficients in the weighting matrix. Then, step 33 is the determination of the first subregion of the field of view in which there is lower homogeneity of the polarization field and/or the magnetic field gradients, in the example in FIG. 2 the regions 26a and 26b. Step S34 is the determination of the reception channels that have increased signal intensity or increased coil sensitivity in this first subregion 26a and 26b. Then, step S35 is the reduction of the weighting of the determined reception channels and the calculation of the local weighting matrix for parallel imaging with the reduced weighting of the reception channels in the inhomogeneity region. It is then possible to calculate the weighting matrix for parallel imaging in step S36. Then, in a step that is not shown, the weighting matrix calculated in this way can be used in the image construction of raw data that was recorded with parallel imaging. The imaging sequence during parallel imaging can be, for example, a spin-echo-based sequence. The method ends with step S37.

The above-described invention enables the reduction or minimization of artifacts that occur during the reconstruction of MR images during parallel imaging.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus utilizing a control computer and MR data acquisition scanner having a plurality of reception coils, with each reception coil having an associated reception channel, said method comprising:

in said computer, operating said MR data acquisition scanner to acquire a reference dataset of a recording volume of an examination subject situated in the MR data acquisition scanner, with said reference dataset being entered into a memory organized as k-space so that said reference dataset completely fills at least one segment of k-space;

in said computer, determining a first subregion of the recording volume, in which at least one component of the MR data acquisition scanner has a lower homogeneity than in a second subregion of the recording volume;

in said computer, determining a first reception channel, among said plurality of reception channels, that supplies, to said computer, acquired signals having a higher signal intensity in said first subregion than others of said plurality of reception channels;

in said computer, using said reference dataset to calculate a weighting matrix in which said first reception channel is given a lower weighting than said other reception channels;

in said computer, operating said MR data acquisition scanner in order to acquire diagnostic MR data from said recording volume with parallel imaging, wherein respective MR diagnostic datasets are individually acquired by said plurality of reception coils and provided to the computer respectively via said plurality of reception channels, and entering said diagnostic MR data into said memory organized as k-space;

in said computer, applying said weighting matrix to said diagnostic MR data in k-space acquired with said parallel imaging, in order to determine points in k-space that were not filled in said parallel imaging; and in said computer, reconstructing image data from said diagnostic MR data and the points in k-space determined with said weighting matrix, and making the image data available from the computer in electronic form, as a data file.

2. A method as claimed in claim 1 comprising, in said computer, reducing the signal intensity of said first reception channel by a factor of at least 1.2 compared to respective signal intensities of said other reception channels, and calculating said weighting matrix using said reduced signal intensity for said first reception channel.

3. A method as claimed in claim 2 comprising, in said computer, adding artificial noise to signals having said reduced intensity before calculating said weighting matrix.

4. A method as claimed in claim 1 comprising filtering the signal intensity in said first reception channel with a smoothing filter before calculating said weighting matrix.

5. A method as claimed in claim 1 comprising, in said computer, replacing the signal intensity in said first reception channel with artificial noise, and calculating said weighting matrix with said artificial noise in said first reception channel.

6. A method as claimed in claim 1 comprising determining said first reception channel using identification data for said recording volume.

7. A method as claimed in claim 6 comprising determining the identification data using parallel sensitivity data respectively for said plurality of reception coils.

8. A method as claimed in claim 6 comprising determining said identification data from MR raw data intensities for a completely filled MR raw dataset entered in k-space with a lower resolution than the image data calculated by applying said weighting matrix in said parallel imaging.

9. A method as claimed in claim 6 comprising determining said identification data from identified regions of said recording volume from a previous scan or examination.

10. A method as claimed in claim 6 comprising determining said identification data from calculations or simulations based on previous knowledge of said examination object and physical properties of said MR data acquisition scanner.

11. A method as claimed in claim 1 comprising, with said computer, operating said MR data acquisition scanner to execute said parallel imaging with a phase encoding direction selected so that said first subregion of said recording volume is situated farther from an isocenter of said MR data acquisition scanner than said second subregion, with said first subregion being connected to said second subregion in said phase encoding direction.

12. A method as claimed in claim 1 comprising displaying an image represented by said image data at a display screen in communication with said computer.

13. A method as claimed in claim 1 comprising, in said computer, determining said first subregion in said recording volume as a subregion of said recording volume wherein a relationship between physical location in said MR data acquisition scanner, and the Larmor frequency of nuclear spins, differs from a reference value by more than 10%.

14. A magnetic resonance (MR) apparatus comprising:
an MR acquisition scanner comprising a plurality of reception coils, each having an associated reception channel;
a computer configured to operate said MR data acquisition scanner to acquire a reference dataset of a recording volume of an examination subject situated in the MR data acquisition scanner, with said reference dataset being entered into a memory organized as k-space so that said reference dataset completely fills at least one segment of k-space;
said computer being configured to determine a first subregion of the recording volume, in which at least one component of the MR data acquisition scanner has a lower homogeneity than in a second subregion of the recording volume;
said computer being configured to determine a first reception channel, among said plurality of reception channel, that supplies, to said computer, acquired signals having a higher signal intensity in said first subregion than others of said plurality of reception channels;
said computer being configured to use said reference dataset to calculate a weighting matrix in which said first reception channel is given a lower weighting than said other reception channels;
said computer being configured to operate said MR data acquisition scanner in order to acquire MR diagnostic data from said recording volume with parallel imaging, wherein respective MR diagnostic datasets are individually acquired by said plurality of reception coils and provided to the computer respectively via said plurality of reception channels, and enter said diagnostic MR data into said memory organized as k-space;
said computer being configured to apply said weighting matrix to said diagnostic MR data in k-space acquired with said parallel imaging, in order to determine points in k-space that were not filled in said parallel imaging; and
said computer being configured to reconstruct image data from said diagnostic MR data and the points in k-space determined with said weighting matrix, and to make the image data available from the computer in electronic form, as a data file.

15. A non-transitory, computer-readable data storage medium encoded with programming instructions, said storage medium being loaded into a computer system of a magnetic resonance (MR) apparatus comprising an MR data acquisition scanner having a plurality of reception coils, each with an associated reception channel, said programming instructions causing said computer system to:
operate said MR data acquisition scanner to acquire a reference dataset of a recording volume of an examination subject situated in the MR data acquisition scanner, with said reference dataset being entered into a memory organized as k-space so that said reference dataset completely fills at least one segment of k-space;
determine a first subregion of the recording volume, in which at least one component of the MR data acquisition scanner has a lower homogeneity than in a second subregion of the recording volume;
determine a first reception channel, among said plurality of reception channel, that supplies, to said computer, acquired signals having a higher signal intensity in said first subregion than others of said plurality of reception channels;
use said reference dataset to calculate a weighting matrix in which said first reception channel is given a lower weighting than said other reception channels;
operate said MR data acquisition scanner in order to acquire MR diagnostic data from said recording volume with parallel imaging, wherein respective MR diagnostic datasets are individually acquired by said plurality of reception coils and provided to the computer respectively via said plurality of reception channels, and enter said diagnostic MR data into said memory organized as k-space;
apply said weighting matrix to said diagnostic MR data in k-space acquired with said parallel imaging, in order to determine points in k-space that were not filled in said parallel imaging; and
reconstruct image data from said diagnostic MR data and the points in k-space determined with said weighting matrix and make the image data available from the computer in electronic form, as a data file.

* * * * *